US005866438A

United States Patent [19]

Itoh et al.

[11] Patent Number: 5,866,438

[45] Date of Patent: Feb. 2, 1999

[54] FIELD EMISSION TYPE ELECTRON EMITTING DEVICE AND METHOD OF PRODUCING THE SAME

[75] Inventors: Junji Itoh, Tsukuba; Takahiko Uematsu, Kawasaki; Yoichi Ryokai, Kawasaki; Masato Nishizawa, Kawasaki; Kazuo Matsuzaki, Kawasaki, all of Japan

[73] Assignees: Fuji Electric Co., Ltd., Kawasaki; Director-General, Jiro Hiraishi, Agency of Industrial Science and Technology, Tokyo, both of Japan

[21] Appl. No.: 59,333

[22] Filed: Apr. 14, 1998

Related U.S. Application Data

[62] Division of Ser. No. 512,686, Aug. 8, 1995, Pat. No. 5,793,153.

[30] Foreign Application Priority Data

Aug. 9, 1994 [JP] Japan .................................... 6-186955

[51] Int. Cl.[6] .................................................... H01L 21/00

[52] U.S. Cl. ................................................................ 438/20

[58] Field of Search ................................................ 438/20

[56] References Cited

U.S. PATENT DOCUMENTS

| | | | |
|---|---|---|---|
| 4,168,213 | 9/1979 | Hoeberechts . | |
| 5,319,233 | 6/1994 | Kane | 257/350 |
| 5,381,069 | 1/1995 | Itoh et al. | 313/310 |
| 5,502,314 | 3/1996 | Hori | 257/10 |

FOREIGN PATENT DOCUMENTS

| | | |
|---|---|---|
| 0 497 509 | 8/1992 | European Pat. Off. . |
| 0 278 405 | 8/1988 | France . |
| 2 657 999 | 8/1991 | France . |
| 2 667 444 | 4/1992 | France . |
| 3-40332 | 2/1991 | Japan . |
| 5-190078 | 7/1993 | Japan . |
| WO 89/09479 | 10/1989 | WIPO . |
| WO 92/04732 | 3/1992 | WIPO . |

OTHER PUBLICATIONS

"Electrical Characteristics of Si–Film Fields Emitter," C. Nureki et al., Extended Abstracts (The 39th Spring Meeting); The Japanese Society of Applied Physics and Realted Societies, p. 578.

"Vacuum Microtriode with Comb–Shaped Lateral Field–Emitter Array," J. Itoh et al., Jpn. J. Appl. Phys. vol. 32 (1993) pp. L809–812 Part 2, No. 6A, 1 Jun. 1993.

*Primary Examiner*—John F. Niebling
*Assistant Examiner*—David A. Zarneke
*Attorney, Agent, or Firm*—Finnegan, Henderson, Farabow, Garrett & Dunner, L.L.P.

[57] ABSTRACT

In a comb-like or wedge-like electron emitting device, an emitter or both an emitter and an anode electrode are processed from a single-crystal silicon thin film of an SOI wafer. The single-crystal silicon thin film in portions other than the processed portion is removed so that the silicon oxide layer is dug down further slightly. A gate electrode for applying an electric field in order to draw electrons out of the emitter is provided in the dug-down portion. When the end and side faces of the emitter are formed as (111) faces by anisotropic etching in the condition that the single-crystal silicon thin film is oriented to a (100) face, the emitter has a sharp edge at about 55° with respect to the substrate. In a conical electron emitting device, the gate electrode is constituted by a single-crystal silicon thin film of an SOI wafer so that a pyramid surrounded by the (111) faces is formed on the single-crystal silicon substrate.

12 Claims, 11 Drawing Sheets

FIELD EMISSION TYPE ELECTRON EMITTING DEVICE AND METHOD OF PRODUCING THE SAME

This is a division of application Ser. No. 08/512,686, filed Aug. 8, 1995, now U.S. Pat. No. 5,793,153.

BACKGROUND OF THE INVENTION

1. Field of the Invention

The present invention relates to a structure of a field emission type electron emitting device using a semiconductor fine processing technique and relates to a method of producing the same.

2. Description of the Related Art

In recent years, micro vacuum electronic tubes have been produced so as to be applied to display units, high-speed switching devices, various kinds of sensors, etc. Hereupon, a technique of forming a micro electron source skillfully has become a key technology. Heretofore, a hot cathode type electron emitting device using thermoelectrons emitted from a heated filament, or the like, has been used popularly as an electron source. The hot cathode type electron emitting device, however, has problems in the large loss of energy caused by heating, the necessity of preparatory heating, etc. To solve these problems, public attention has been paid onto a field emission type (cold cathode type) electron emitting device, and some proposals have been made.

FIG. 11 is a partly perspective view showing an example of the field emission type electron emitting device. This is now called "conical (or pyramidal) electron emitting device 101". As shown in the drawing, a conical emitter 12 made of molybdenum (hereinafter simply referred to as "Mo") or the like is provided on a silicon substrate 11. There is formed an insulating layer 14 of a silicon oxide, or the like, having a portion opened around the emitter 12. Further, a gate electrode 13 having an end portion formed in the vicinity of the pointed end portion of the conical emitter 12 is provided thereon. In the field emission type electron emitting device configured as described above, when a voltage is applied between the silicon substrate 11 and the gate electrode 13, electrons are emitted from the pointed end portion of the emitter 12 which is high in the intensity of electric field.

FIGS. 13A to 13E are partly sectional views in respective steps for explaining the method of producing the conical electron emitting device 101 shown in FIG. 11. The steps will be described below with reference to the drawings.

An insulating layer 14 is formed on a silicon substrate 11. Further, by an electron beam vapor deposition method, the insulating layer 14 is coated with an Mo layer 131 which constitutes a gate electrode 13. Then, a photoresist is applied thereonto and then subjected to exposure and development so that a first pattern 161 is formed as shown in FIG. 13A. Then, the Mo layer 131 and the insulating layer 14 are selectively etched with use of the photoresist pattern 161 as a mask to thereby form a first opening portion 181 and a second opening portion 182. The Mo layer 131 having the first opening portion 181 is formed as a gate electrode 13 as shown in FIG. 13B. Then, the silicon substrate 11 is inclined by a predetermined angle θ while rotated in a substrate plane, so that aluminum (hereinafter abbreviated to Al) is evaporated so as to be deposited on an upper face of the gate electrode 13 and on a side face of the first opening portion 181 to thereby form an Al layer 191 as shown in FIG. 13C. Then, by an electron beam vapor deposition method, Mo is applied perpendicularly to the silicon substrate 11. In this occasion, Mo is deposited not only both on the upper face of the Al layer 191 and on the silicon substrate 11 but also on the side face of the Al layer 191. Accordingly, the diameter of the first opening portion 181 decreases as the Mo layer 192 is deposited. Because the vapor deposition range of Mo deposited on the silicon substrate 11 decreases as the diameter of the first opening portion 181 gradually decreases, a nearly conical emitter 12 is formed on the silicon substrate 11 as shown in FIG. 13D. Finally, the deposited Mo and Al layers 192 and 191 are removed to thereby form a conical electron emitting device 101 having such a nearly conical emitter 12 as shown in FIG. 13E.

In the field emission type electron emitting device of FIG. 11 according to the aforementioned producing method, there is however such a tendency that reproducibility in the case where the same shape is repeatedly formed is not satisfied because the conical emitter 12 is formed by vapor deposition. For this reason, there arises a disadvantage in that electron emitting characteristic particularly sensitively influenced by the radius of curvature of the topmost end of the emitter 12 and by the distance between the emitter 12 and the gate electrode 13 varies widely.

Upon such a background, an electron emitting device having a new shape and being good in uniformity of electron emitting characteristic has been published recently in Journal of Semiconductor World, March 1992, p. 62, by Kanamaru and Ito. FIG. 12 is a partly perspective view of the electron emitting device. This is now called "a comb-like electron emitting device 102". An insulating layer convex portion 241 and an insulating layer concave portion 242 are formed in an insulating layer 24 on a silicon substrate 21 (FIGS. 14A–14D). An emitter 22 made of Mo and having a plurality of emitter end portions 221 on one side is disposed on the insulating layer convex portion 241. On the other hand, a gate electrode 23 is formed on the insulating layer concave portion 242 so as to be opposite to the emitter end portion 221. Also in this electron emitting device, by applying a voltage between the emitter 22 and the gate electrode 23, electrons are emitted from the end of the emitter end portion 221 which is high in the intensity of electric field. This structure can be produced relatively easily by a conventional semiconductor producing process, so that this producing method is a method considerably improved in reduction of scattering in the producing steps. Further, not only the emitter 22 and the gate electrode 23 shown in FIG. 12 can be formed but also other electrodes such as an anode electrode for collecting emitted electrons, a control electrode for controlling electrons reaching the anode electrode, and so on, can be formed.

FIGS. 14A to 14D and FIGS. 15A to 15C are partly sectional views showing the steps of producing the comb-like electron emitting device 102 shown in FIG. 12. The steps will be described below successively. For example, an oxide film as an insulating layer 24 is applied onto a silicon substrate 21. Further, a tungsten film (hereinafter simply referred to as "a W film") 222 which constitutes an emitter is deposited on the whole surface of the insulating film 24 by means of sputtering (FIG. 14A). Then, a photoresist is applied onto the W film 222 so that a first pattern 261 is formed by using a photomask not shown. The W film 222 is etched by reactive ion etching (RIE) with use of the photoresist pattern 261 as a mask (FIG. 14B). Further, the insulating layer 24 is etched by about 1 μm with use of the resist pattern 261 and the W film 222 as a mask so that an insulating layer convex portion 241 and an insulating layer concave portion 242 are formed (FIG. 14C). A niobium film (hereinafter abbreviated to "an Nb film") 231 which constitutes a gate electrode 23, and an aluminum film (hereinafter abbreviated to "an Al film")/Mo film 232 are applied onto the substrate by vacuum vapor deposition. The Al film/Mo film 232 and the Nb film 231 on the insulating layer convex portion 241 are removed by a lift-off method (FIG. 14D). A photoresist is applied again so that a second pattern 262 is formed by using a second mask not shown. The Al film/Mo film 232 and the Nb film 231 are etched by reactive ion etching (RIE) with use of the photoresist pattern 262 as a mask (FIG. 15A). Further, a photoresist is applied once more so that a comb-like pattern 263 is formed by using a third mask not shown. By reactive ion etching (RIE) with use of the photoresist pattern 263 as a mask, a comb-like emitter 22 is formed. In this occasion, the gate electrode 23 is not masked but the AL film serves as a protection film so that the gate electrode 23 is not processed into a comb shape (FIG. 15B). Finally, the Al film/Mo film 232 is etched and the surface of the insulating layer 24 is further etched with a buffer hydrofluoric acid, so that electrical insulation between the emitter and the gate electrode is improved. Thus, this process is completed (FIG. 15C). As metal materials used for the emitter and the gate electrode, W, Mo, Nb, etc. are selected on the basis of work function expressing the degree of easiness of flying of electrons, surface stability in the process and after the process, durability in a long term, etc.

As FIGS. 14A to 14D and FIGS. 15A to 15C show the producing steps, not only the comb-like electron emitting device 102 of FIG. 12 is large in the number of photoetching steps, that is, large in the number of times for forming a photoresist pattern and for performing etching with use of the photoresist pattern as a mask, but also many kinds of metal materials are used in the comb-like electron emitting device 102 of FIG. 12 compared with the structure of the conical electron emitting device 101 shown in FIG. 11. Accordingly, there is a limitation in selection of the etching method and etching solution to be used. Further, the emitter is produced from a polycrystalline metal thin film. In the thin film, there is some crystal grain boundary between crystals having a size of about 0.1 $\mu$m. Because there is difference in etching speed, for example, in dry etching, between the inside and the outside with respect to the grain boundary, the shape of the end portion of the emitter is apt to be formed along the grain boundary. There arises a disadvantage in that as a result, the shape varies widely. Because the shape of the end portion of the emitter has a direct influence onto a field emission current emitted from the emitter, it is difficult to practically use the emitter the shape of which varies widely.

As described above, the conventional field emission type electron emitting device is not sufficient for the design concerning the combination of structures and materials. As a result, not only it is a matter of course that electron emitting characteristic varies correspondingly to each lot, but also the characteristic is not uniform in the same substrate in the same lot. Further, in the producing process, a measure to solve the problem caused by the defect in the combination of structures and materials is not taken, either.

SUMMARY OF THE INVENTION

Upon the aforementioned problems, an object of the present invention is to provide a field emission type electron emitting device in which materials and the spatial arrangement thereof are optimized for greatly improving reproducibility and uniformity compared with the conventional example, and to provide a method of producing the field emission type electron emitting device so that the structure of the electron emitting device can be reproduced efficiently.

To solve the aforementioned problems, the present invention provides a field emission type electron emitting device having an emitter disposed on a peak face of a convex portion of an insulating layer which is convex in section, and a gate electrode provided on a valley face of the convex portion of the insulating layer so as to be opposite to the emitter and supplied with a voltage for drawing electrons out of the emitter, wherein the emitter is constituted by a silicon thin film formed on the insulating layer.

Further, in a field emission type electron emitting device having an emitter disposed on a peak face of one of a plurality of convex portions of an insulating layer, a gate electrode provided on a valley face between the convex portions of the insulating layer so as to be opposite to the emitter and supplied with a voltage for drawing electrons out of the emitter, and an anode electrode disposed on a peak face of another one of the convex portions in order to collect electrons emitted from the emitter, the emitter and the anode electrode are constituted by a silicon thin film formed on the insulating layer.

Particularly, the emitter is preferably constituted by a single-crystal silicon thin film formed on the insulating layer or both the emitter and the anode electrode are preferably constituted by a single-crystal silicon thin film formed on the insulating layer, and the single-crystal silicon thin film is preferably constituted by a silicon single-crystal thin film having a (100) crystal face as a main surface.

Further, the insulating layer is preferably provided as a silicon oxide film which is formed by thermal oxidation of a single-crystal silicon substrate.

Preferably, the emitter has a pointed end portion which serves to radiate electrons and which is constituted by two or more (111) faces.

Preferably, the emitter is shaped like a comb or like a wedge in a plan view so that electrons are radiated from the comb-like or wedge-like end portion thereof.

Further, in a field emission type electron emitting device having a conical or pyramidal emitter, and a gate electrode disposed around a pointed end of the emitter so as to be supplied with a voltage for drawing electrons out of the emitter, the gate electrode is made of a silicon thin film formed on an insulating layer.

Particularly, the gate electrode is preferably made of a single-crystal silicon thin film formed on an insulating layer, and the insulating layer is preferably made of a silicon oxide film formed by thermal oxidation of a single-crystal silicon substrate.

Further, the emitter is preferably made of single-crystal silicon epitaxially grown on the single-crystal silicon substrate.

Further, the single-crystal silicon substrate preferably has a (100) crystal face as a main surface, and the emitter preferably has a pointed end portion which serves to radiate electrons and which is constituted by two or more (111) faces.

Further, in a method of producing a field emission type electron emitting device having an emitter disposed on a peak face of a convex portion of an insulating layer which is convex in section, and a gate electrode provided on a valley face of the convex portion of the insulating layer so as to be opposite to the emitter and supplied with a voltage for drawing electrons out of the emitter, there is preferably used an SOI substrate of the type having a single-crystal silicon substrate and a single-crystal silicon thin film stuck to each other through a thermally oxidized silicon film.

Further, the method comprises the steps of: first, forming a roughly rectangular emitter in the SOI substrate; next, removing the thermally oxidized silicon film by a required thickness by means of etching to thereby form a concave portion on a side of the emitter; depositing a gate electrode material onto the whole surface; removing the electrode material deposited on portions other than the concave portion on the side of the emitter by a lift-off method and by means of etching; and finally, processing the roughly rectangular shape of the emitter electrode into a desired shape.

Further, when the single-crystal silicon thin film is processed so that the emitter is shaped like a comb or like a wedge in a top view, the pointed end portion of the emitter is processed by an anisotropic wet etching method to thereby form the comb-like or wedge-like shape from at least two (111) faces.

Further, in a method of producing a field emission type electron emitting device having a conical or pyramidal emitter, and a gate electrode disposed around a pointed end of the emitter so as to be supplied with a voltage for drawing electrons out of the emitter, there is preferably used an SOI substrate of the type having a single-crystal silicon substrate and a single-crystal silicon thin film stuck to each other through a thermally oxidized silicon film.

Further, the method comprises the steps of: applying a dry etching method to the single-crystal silicon thin film stuck to the single-crystal silicon substrate having a thermally oxidized surface to thereby form an opening portion as the gate electrode; removing the thermally oxidized silicon film by etching with a buffer hydrofluoric acid through the opening portion of the single-crystal silicon thin film to thereby expose the surface of the single-crystal silicon substrate; next depositing amorphous silicon onto the exposed portion of the single-crystal silicon substrate by a sputtering method or by a vacuum vapor deposition method; then heating the amorphous silicon or radiating ion beams onto the amorphous silicon to thereby monocrystallize a part of the amorphous silicon in accordance with the orientation of the substrate; and finally, removing portions other than the monocrystallized portion of the amorphous silicon by an anisotropic wet etching method to thereby form as the emitter a monocrystallized pointed end portion constituted by at least two (111) faces.

Particularly, the emitter may be made of a single-crystal silicon epitaxially grown on a surface of the single-crystal silicon substrate which is a bottom of the opening portion formed by removing the thermally oxidized silicon film under the gate electrode.

First, in a field emission type electron emitting device having an emitter disposed on a peak face of a convex portion of an insulating layer which is convex in section, and a gate electrode provided on a valley face of the convex portion of the insulating layer so as to be opposite to the emitter and supplied with a voltage for drawing electrons out of the emitter, or in a field emission type electron emitting device having an emitter disposed on a peak face of one of a plurality of convex portions of an insulating layer, a gate electrode provided on a valley face between the convex portions of the insulating layer so as to be opposite to the emitter and supplied with a voltage for drawing electrons out of the emitter, and an anode electrode disposed on a peak face of another one of the convex portions in order to collect electrons emitted from the emitter, not only a thin film of further higher purity than the conventionally used metal film such as a W film, an Mo film, or the like, is obtained but also a single crystal is obtained easily as long as the emitter or both the emitter and the anode electrode are constituted by a silicon thin film formed on the insulating layer.

The material for the emitter is not limited to the refractory metal such as Mo, W, or the like, as shown in FIGS. 11 and 12. For example, silicon which matches the semiconductor process well is a material which can be used in the present invention. The work function of silicon which is a rule of thumb for determining easiness of electron emission is slightly smaller than those of W and Mo but there is no problem when silicon is used as an electron emitting material.

Particularly, when the silicon thin film is a single-crystal thin film, non-uniformity caused by the crystal grain boundary as described preliminarily is avoided.

If the single-crystal silicon thin film has a (100) crystal face as a main surface, a good boundary is obtained between the single-crystal silicon thin film and a silicon oxide which is an insulating layer. Furthermore, by employing a producing method which will be described later, a shape using crystal faces can be formed.

The emitter shaped like a comb or like a wedge in a plan view can be designed to have a sharp pointed end portion constituted by (111) and (100) faces.

On the other hand, also in a field emission type electron emitting device having a conical or pyramidal emitter, and a gate electrode disposed around a pointed end of the emitter so as to be supplied with a voltage for drawing electrons out of the emitter, a thin film of further higher purity than the conventionally used metal film such as a W film, an Mo film, or the like, as long as the gate electrode is made of a silicon thin film formed on an insulating layer.

Particularly, when the gate electrode is made of a single-crystal silicon thin film formed on an insulating layer, the uniformity caused by the crystal grain boundary as described above is avoided.

Further, when the emitter is selectively made of single-crystal silicon epitaxially grown on the single-crystal silicon substrate, the uniformity caused by the crystal grain boundary is avoided.

Further, in the case where the single-crystal silicon substrate has a (100) crystal face as a main surface, and the emitter has a pointed end portion which serves to radiate electrons and which is constituted by two or more (111) faces, the (111) faces are faces which are not only densest but also easy to be controlled by anisotropic etching. As a result, the emitter can be made to have a sharp pointed end portion constituted by the (111) faces.

Next, in a method of producing the aforementioned field emission type electron emitting device, a good-quality insulating layer and a good-quality silicon thin film are obtained easily as long as there is used an SOI (Silicon On Insulator) wafer of the type having a single-crystal silicon substrate and a single-crystal silicon thin film stuck to each other through a thermally oxidized silicon film.

Further, in the case where the method comprises the steps of: first, forming a roughly rectangular shape of an emitter in the SOI substrate; next, removing the thermally oxidized silicon film by a required thickness by means of etching to thereby form a concave portion on a side of the emitter; finally, depositing a gate electrode material onto the whole surface; removing the electrode material deposited on portions other than the concave portion on the side of the emitter by a lift-off method and by means of etching; and finally processing the roughly rectangular shape of the emitter electrode into a desired shape; it is possible to obtain a field emission type electron emitting device good in reproducibility and stable in quality.

Further, in the case where the pointed end portion of the emitter is processed by an anisotropic wet etching method, a wedge-like or comb-like emitter having a sharp edge constituted by at least two (111) faces can be formed.

Further, in a method of producing a field emission type electron emitting device having a conical or pyramidal emitter, and a gate electrode disposed around a pointed end of the emitter so as to be supplied with a voltage for drawing electrons out of the emitter, a good-quality insulating layer and a good-quality silicon thin film can be obtained easily to contribute stabilization of quality as long as there is used an SOI wafer of the type having a single-crystal silicon substrate and a single-crystal silicon thin film stuck to each other through a thermally oxidized silicon film.

Further, in the case where the method comprises the steps of: applying a dry etching method to the single-crystal silicon thin film of the SOI wafer to thereby form a circular opening portion as the gate electrode; removing the thermally oxidized silicon film by etching with a buffer hydrofluoric acid through the opening portion of the single-crystal silicon thin film to thereby expose the surface of the single-crystal silicon substrate; depositing amorphous silicon onto the exposed portion of the single-crystal silicon substrate by a sputtering method or by a vacuum vapor deposition method; then, heating the amorphous silicon or radiating ion beams onto the amorphous silicon to thereby monocrystallize a part of the amorphous silicon in accordance with the orientation of the substrate; and finally removing portions other than the monocrystallized portion of the amorphous silicon by an anisotropic wet etching method to thereby form as the emitter a single-crystal silicon pointed end portion constituted by at least two (111) faces; it is possible to obtain a field emission type electron emitting device good in reproducibility and stable in quality.

Particularly in the case where the emitter is made of a single-crystal silicon epitaxially grown on a surface of the single-crystal silicon substrate which is a bottom of the opening portion formed by removing the thermally oxidized silicon film under the gate electrode, it is possible to form a pyramid-like emitter having a sharp edge constituted by at least two (111) faces.

DETAILED DESCRIPTION OF THE PREFERRED EMBODIMENTS

Embodiments of the present invention will be described below with reference to the drawings.

Figure 1:
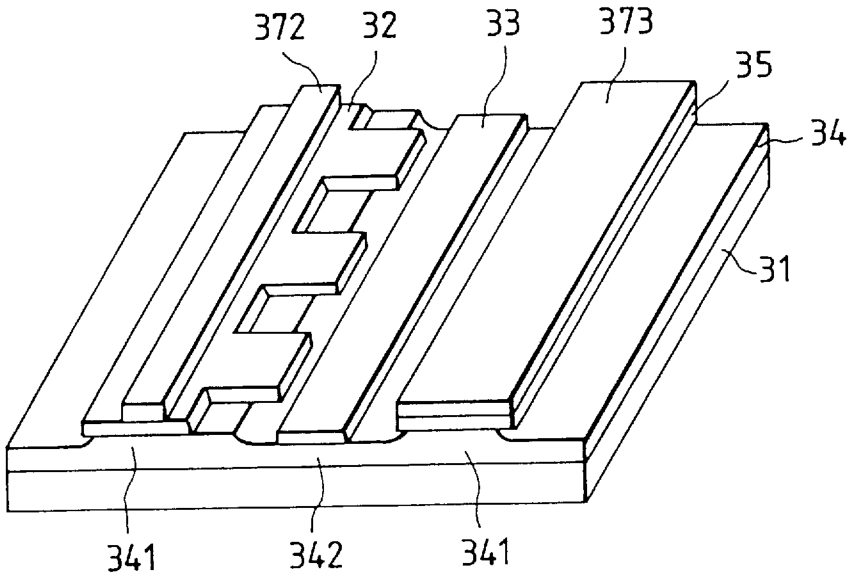
FIG. 1 is a partly perspective view of an electron emitting device according to a first embodiment of the present invention.

FIG. 1 is a perspective view of a field emission type electron emitting device as an embodiment of the present invention. On a silicon oxide layer 34 on a silicon substrate 31, there are provided steps with respect to which a comb type emitter 32 and an anode electrode each of which is made of a single-crystal silicon thin film are arranged on insulating layer convex portions 341, respectively, and a gate electrode 33 made of a high melting point metal is arranged on an insulating layer concave portion 342 between the emitter 32 and the anode electrode 35. Further, an emitter pad 372 made of an Mo film and an anode pad 373 are provided on the emitter 32 and the anode electrode 35, respectively. These pads are effective for reduction of wiring resistance, protection of the emitter 32 and the anode electrode 35, and so on.

Figure 11:
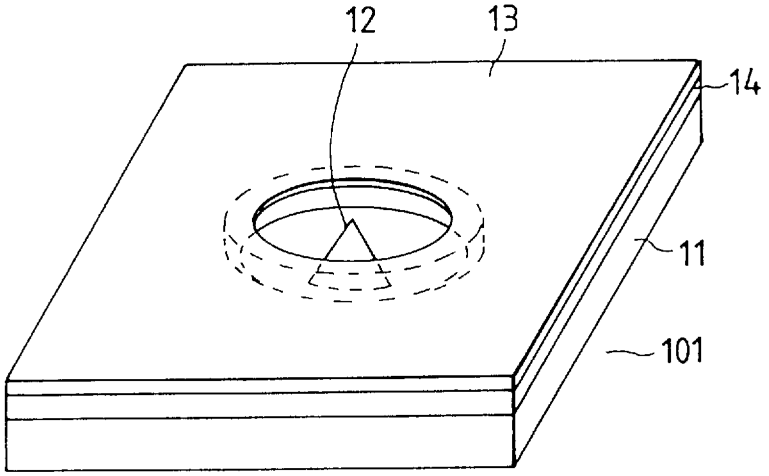
FIG. 11 PRIOR ART
FIG. 11 is a partly perspective view showing an example of a conventional electron emitting device.
Figure 12:
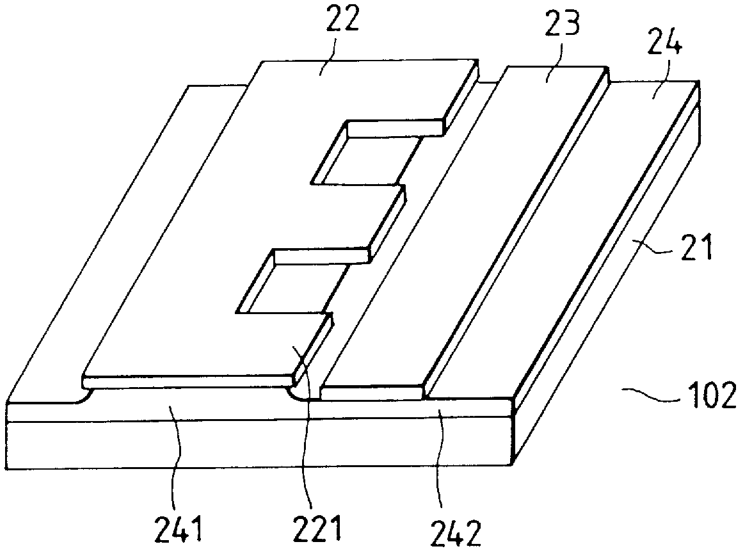
FIG. 12 PRIOR ART
FIG. 12 is a partly perspective view showing another example of the conventional electron emitting device.
Figure 13A:
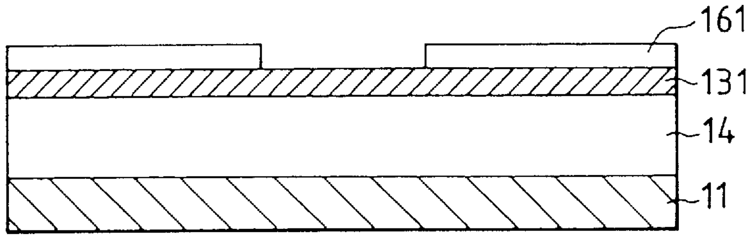
FIG. 13A PRIOR ART
FIGS. 13A to 13E are partly sectional views successively showing steps of producing the electron emitting device shown in FIG. 11.
Figure 13B:
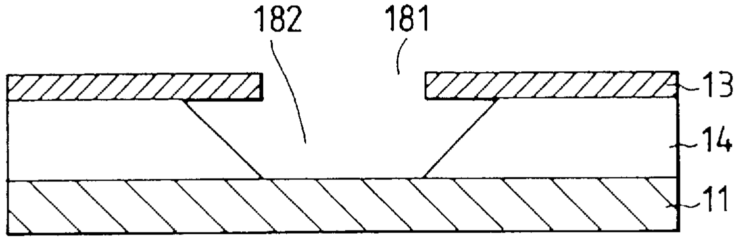
FIG. 13B PRIOR ART
Figure 13C:
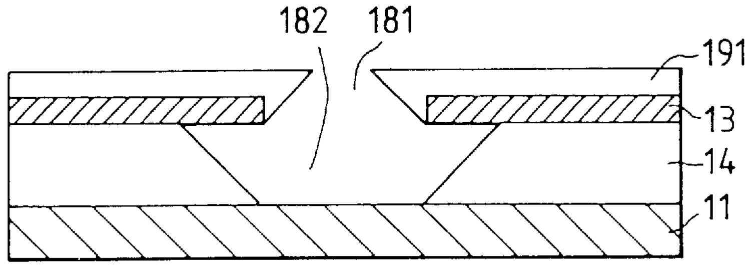
FIG. 13C PRIOR ART
Figure 13D:
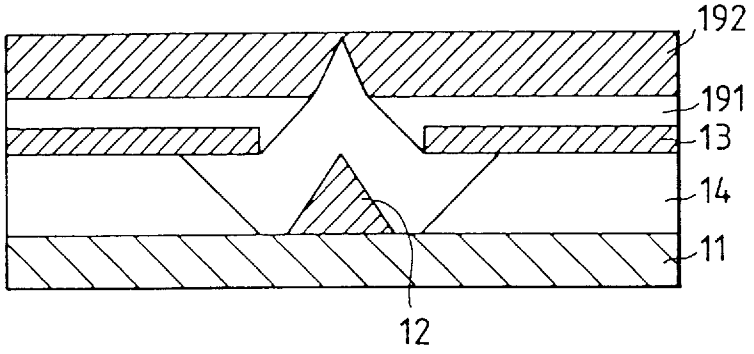
FIG. 13D PRIOR ART
Figure 13E:
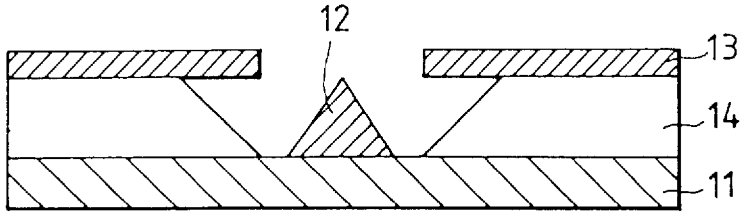
FIG. 13E PRIOR ART
Figure 14A:
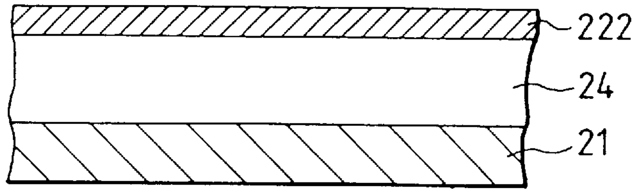
FIG. 14A PRIOR ART
FIGS. 14A to 14D are partly sectional views successively showing steps of producing the electron emitting device shown in FIG. 12.
Figure 14B:
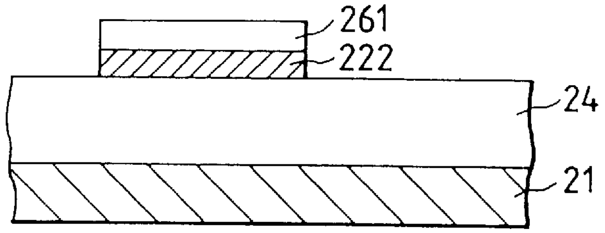
FIG. 14B PRIOR ART
Figure 14C:
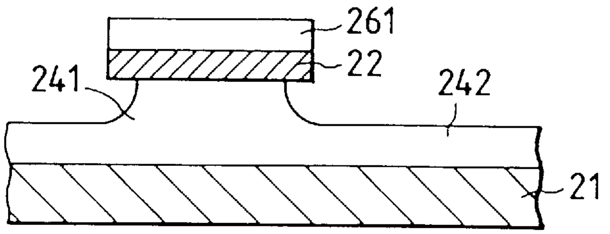
FIG. 14C PRIOR ART
Figure 14D:
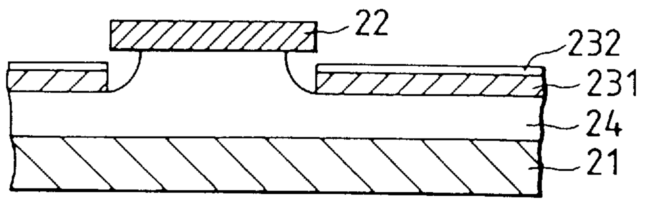
FIG. 14D PRIOR ART
Figure 15A:
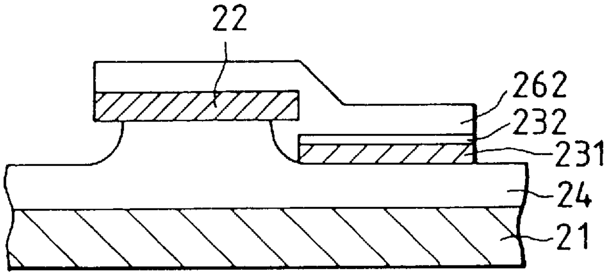
FIG. 15A PRIOR ART
FIGS. 15A to 15C are partly sectional views continued from FIG. 14D, successively showing steps of producing the electron emitting device shown in FIG. 12.
Figure 15B:
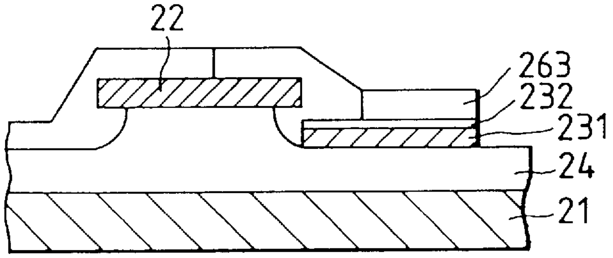
FIG. 15B PRIOR ART
Figure 15C:
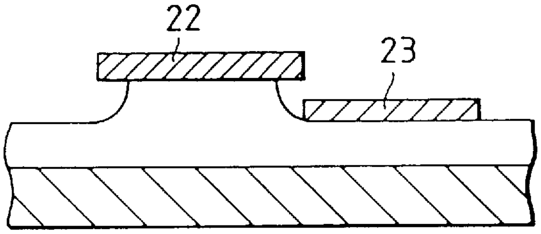
FIG. 15C PRIOR ART

In the case where the emitter 32 is made of a silicon thin film formed on an insulating layer in the manner as described above, a thin film of further higher purity than a conventionally used metal film such as a W film, an Mo film, or the like, is obtained. As a result, when a particularly fine structure is to be produced, non-uniformity caused by impurities is avoided so that the thin film is excellent in shape reproducibility after processing. The material for the emitter is not limited to the refractory metal such as Mo, W, or the like, as shown in FIGS. 11 and 12. For example, silicon which matches a semiconductor process better may be a material for the emitter. The work function of silicon which is a rule of thumb for determining easiness of electron emission is slightly smaller than those of W and Mo but there is no problem at all when silicon is used as an electron emitting material.

Particularly, it is very difficult to obtain a single crystal of a refractory metal such as W, Mo, or the like, whereas it is easy to obtain a single crystal of silicon. In the case of a silicon thin film constituted by a single crystal thin film, not only sharpness of a pointed end is attained but also the thin film is excellent in form reproducibility after processing compared with the case of a metal cold cathode because non-uniformity caused by a crystal grain boundary is avoided as described above. Further, in the case of a single-crystal silicon thin film having a (100) crystal face as a main surface, a good boundary is obtained between the single-crystal silicon thin film and a silicon oxide layer which is an insulating layer.

Figure 2:
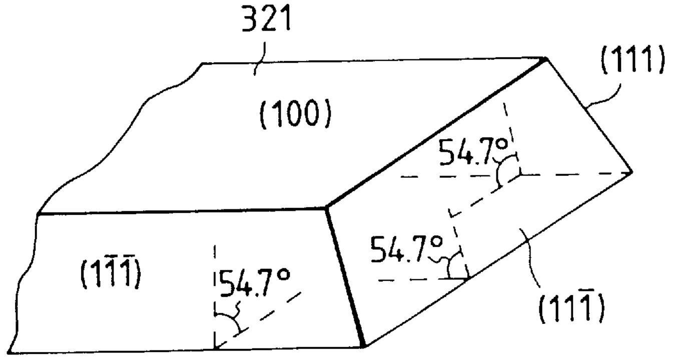
FIG. 2 is an enlarged view of a pointed end portion of an emitter of the electron emitting device shown in FIG. 1.

FIG. 2 is an enlarged view of a pointed end portion 321 of the emitter 32. Assuming now that the crystal orientation of the single-crystal thin film of the emitter 32 is, for example, defined so that the main surface is a (100) face and the direction of the teeth of the comb is <0,1,−1>, then the side and front faces of one tooth of the comb are formed as three (111) faces, namely, (1,1,1) face, (1,1,−1) face and (1,1,−1) face, by anisotropic wet etching which will be described later. As a result, there is formed a sharp edge in which the three (111) faces intersect the substrate face at angles of about 55° as shown in FIG. 2. That is, the form of the comb-like end portion 321 of the emitter from which electrons are emitted is defined by the crystal faces, so that the end portion 321 is sharpened with very excellent reproducibility to thereby improve electron emitting characteristic.

In the case of an insulating layer which is constituted by a silicon oxide layer formed by thermal oxidation of a single-crystal silicon substrate, not only the insulating layer fits the silicon thin layer well but also the insulating layer can be formed easily as described preliminarily.

Figure 3A:
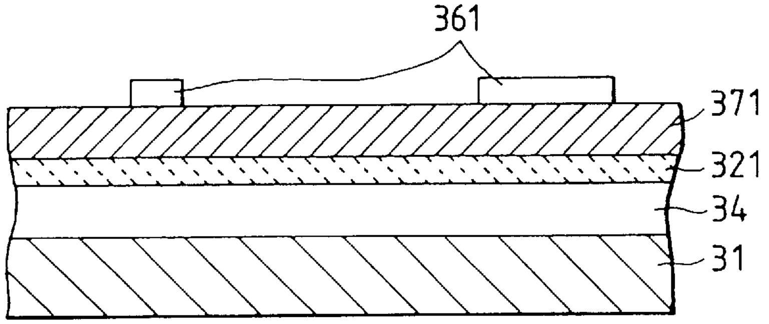
FIGS. 3A to 3D are partly sectional views successively showing steps of producing the electron emitting device shown in FIG. 1.
Figure 3B:
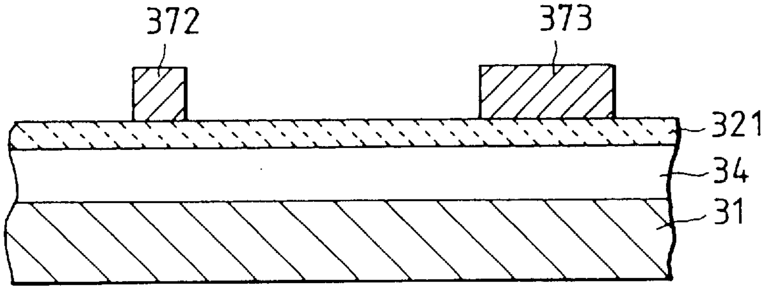
Figure 3C:
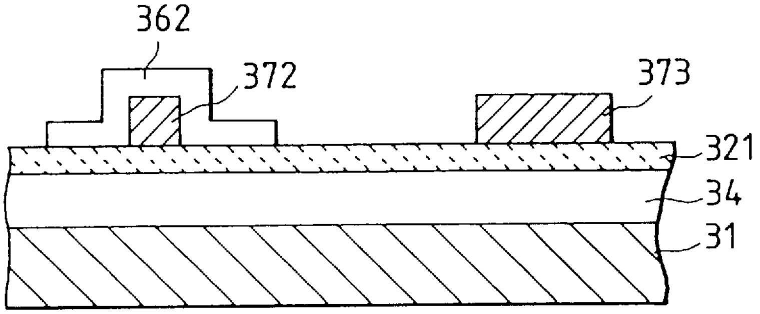
Figure 3D:
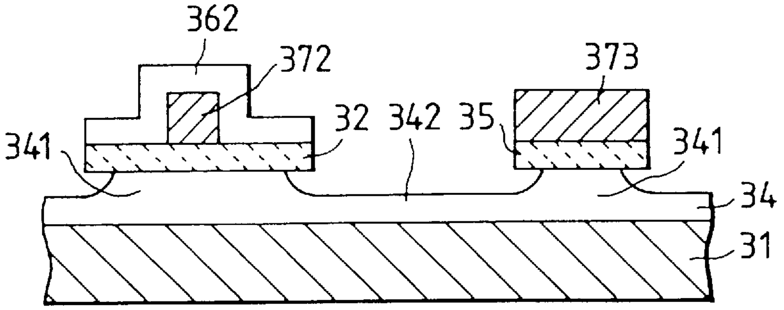
Figure 4A:
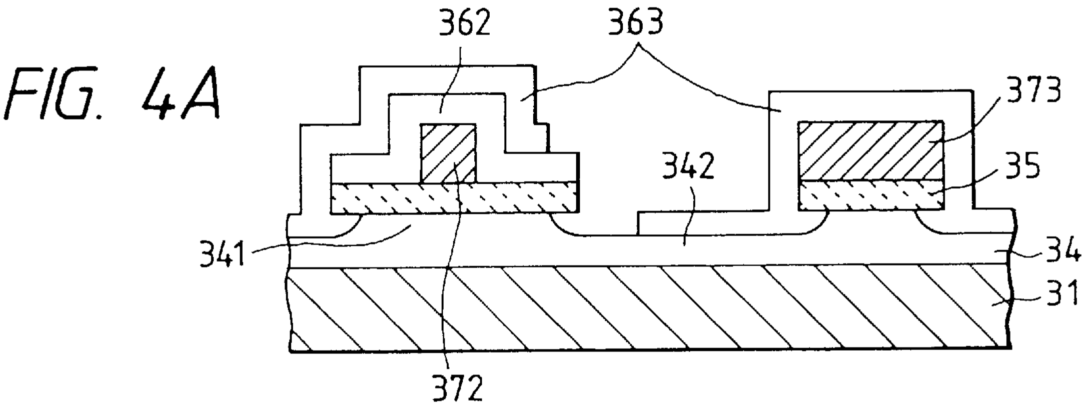
FIGS. 4A to 4D are partly sectional views continued from FIG. 3D, successively showing steps of producing the electron emitting device shown in FIG. 1.
Figure 4B:
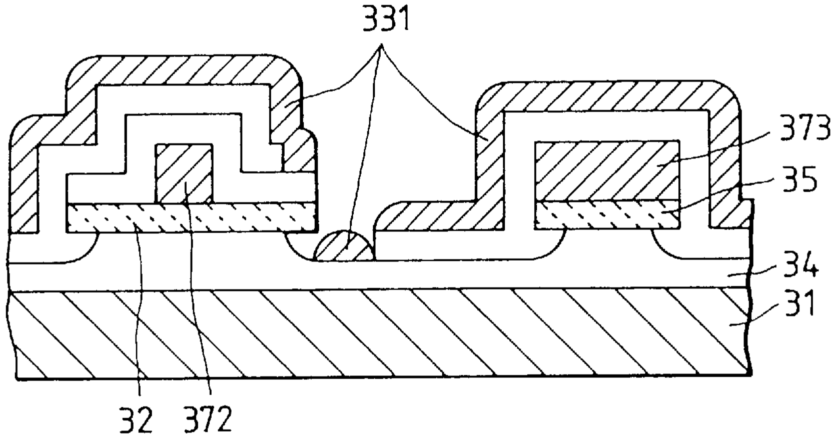
Figure 4C:
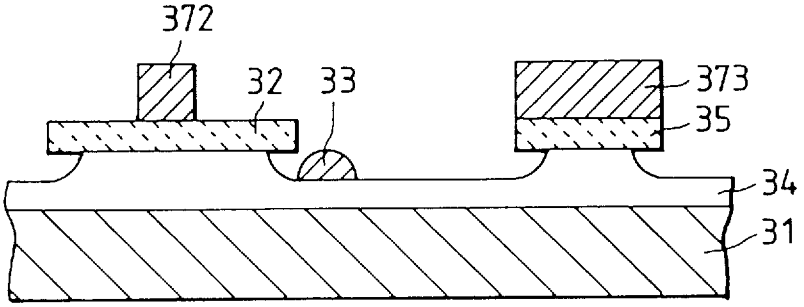
Figure 4D:
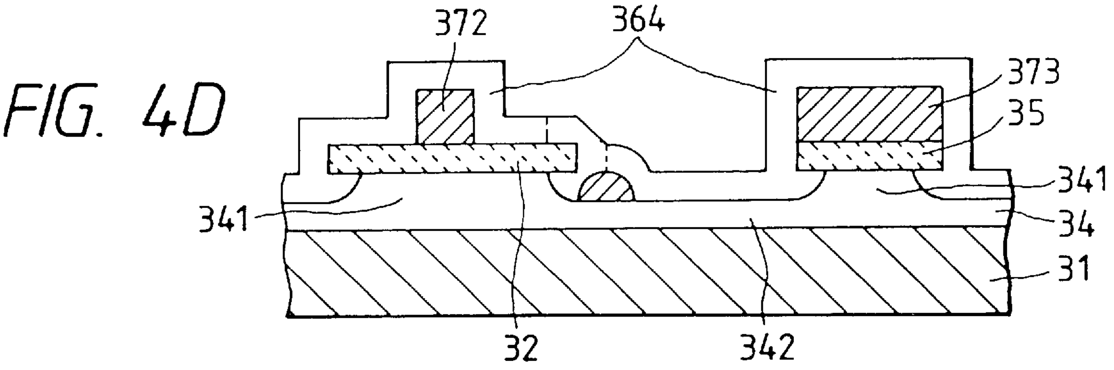
Figure 5A:
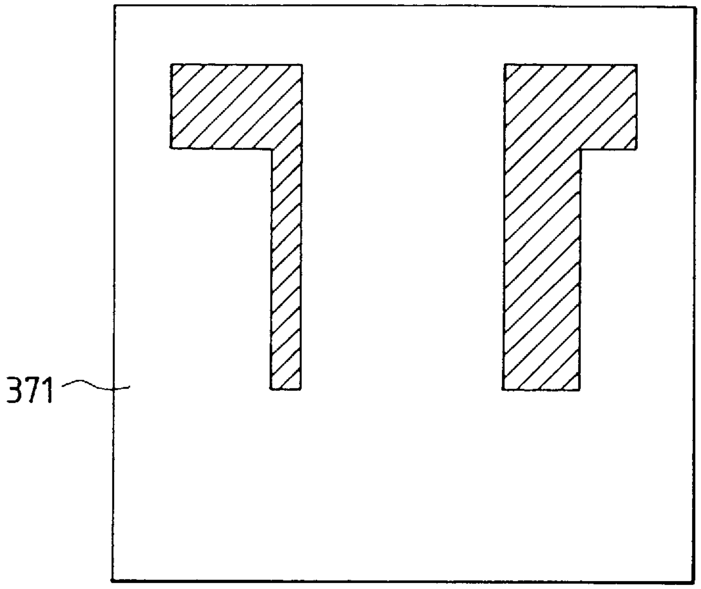
FIGS. 5A and 5B are plan views of photomasks used in the electron emitting device producing steps shown in FIGS. 3A to 3D.
Figure 5B:
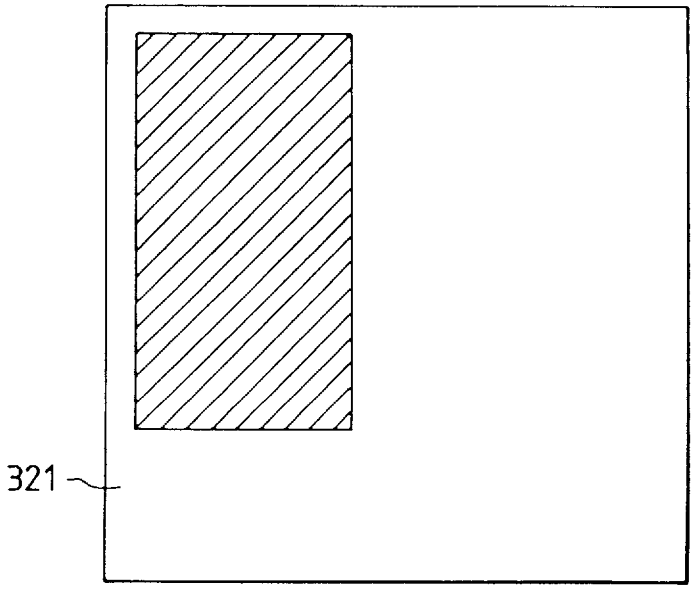
Figure 6A:
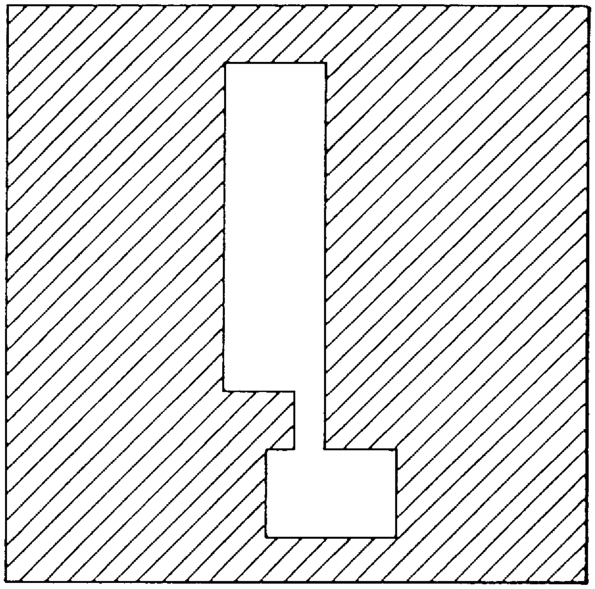
FIGS. 6A and 6B are plan views of photomasks used in the electron emitting device producing steps shown in FIGS. 4A to 4D.
Figure 6B:
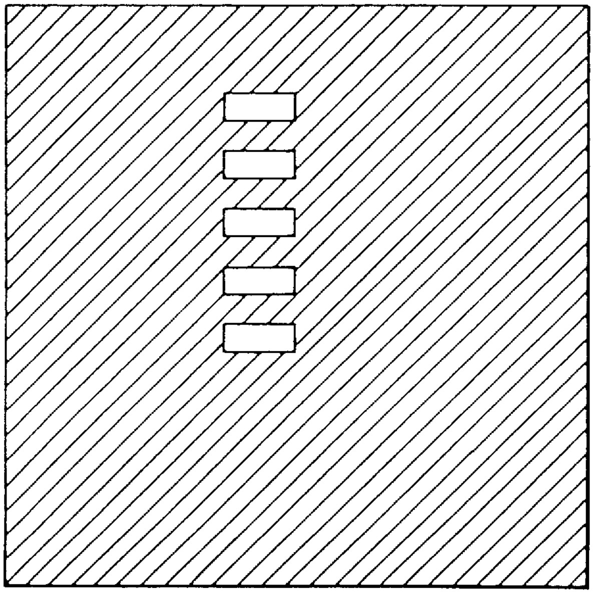

Next, a process of producing a field emission type electron emitting device according to the preset invention will be described. FIGS. 3A to 3D and FIGS. 4A to 4D are sectional views for explaining steps in the process of producing the electron emitting device of FIG. 1; FIGS. 5A and 5B are plan views of photomasks used in the producing steps shown in FIGS. 3A to 3D; and FIGS. 6A and 6B are plan views of photomasks used in the producing steps shown in FIGS. 4A to 4D. With respect to an SOI wafer composed of a silicon substrate 31, a silicon oxide layer 34 and a single-crystal silicon thin film 321 (silicon thin film thickness: 0.2 $\mu$m, silicon oxide layer thickness: 2 $\mu$m), the silicon thin film 321 of the SOI wafer is coated with Mo by electron beam vapor deposition so that an Mo film 371 having a thickness of 1 $\mu$m is formed on the silicon thin film 321. A photoresist is applied onto the Mo film 371 and then exposure and development are made with use of a mask shown in FIG. 5A to thereby form a pattern 361 (FIG. 3A). Then, the Mo film 371 is etched with use of the photoresist pattern 361 as a mask to thereby form an emitter pad 372 and an anode pad 373 in the emitter portion and the anode portion, respectively, and form other pads, wirings and the like, which are not shown but are to be connected to electrodes (FIG. 3B). In this occasion, the solution for etching the Mo film 371 is a mixture solution of 1:1:5 a proportion of sulfuric acid, nitric acid and pure water. Then, a photoresist is applied so that a second pattern 362 is formed on the single-crystal silicon thin film 321 and on a portion where the emitter 32 is to be formed with use of a mask shown in FIG. 5B (FIG. 3C). Then, the single-crystal silicon thin film 321 and the silicon oxide layer 34 under the single-crystal silicon thin film 321 are etched (FIG. 3D). The etching of the single-crystal silicon thin film 321 is performed by means of plasma etching using a sulfur hexafluoride. On the other hand, a buffer hydrofluoric acid which is available is used in the etching of the silicon oxide layer 34 so that the silicon oxide layer 34 is etched by 1 $\mu$m to shape the silicon thin film 321 like a hood. Incidentally, the photoresist is not required on the anode side because the anode pad 373 serves as a mask. When the single-crystal silicon thin film 321 is etched, the anode side is etched so slightly that there arises no problem. In this state, application of a photoresist for forming the gate electrode 33 by a lift-off method and exposure and development using a mask shown in FIG. 6A are performed to form a third pattern 363 (FIG. 4A). Then, an Mo film 331 is applied by electron beam vapor deposition (FIG. 4B). Then, in acetone, ultrasonic wave is applied to the Mo film on the pattern 363 to thereby lift off the Mo film to thereby form a gate electrode 33, a wiring pad connected to the gate electrode 33 and a wiring (FIG. 4C). Then, a fourth pattern 364 of a photoresist is formed in order to process the hood portion of the single-crystal silicon thin film 321 so as to be like teeth of a comb (FIG. 4D). In this occasion, a mask shown in FIG. 6B is used. Finally, plasma etching using sulfur hexafluoride and anisotropic etching using a potassium hydroxide solution are performed to thereby generate the form of the emitter 32 and remove the fourth pattern 364. Thus, the process is terminated.

In the aforementioned producing method, the single-crystal silicon thin film 321 on the silicon oxide layer 34 was processed to the emitter 32 by using the SOI wafer. In recent years, the SOI wafer has been widely used as an integrated circuit substrate for the purposes of preventing mutual inference between semiconductor devices, hastening the operation of the devices and making the devices tolerable against environment in an integrated circuit. Upon such a background, the quality of the SOI wafer has been improved so that the specifications thereof have been obtained in a considerable technical level. For example, there has been obtained an SOI wafer composed of a silicon thin film having a thickness of 50 to 300 nm with the amount of scatter of ±5 to ±10%, and a silicon oxide layer (which is an insulating layer) having a thickness of 1 to 2 $\mu$m with the amount of scatter of ±0.3 $\mu$m. Because the thickness of the thin film constituting an emitter is an important factor for making the form of the emitter uniform, the following features are obtained by employing a method of processing the silicon thin film of such a uniform SOI wafer to a field emission type electron emitting device.

(1) Because of the single crystal, the pointed end is sharpened compared with the metal emitter.

(2) The thickness of the emitter can be controlled accurately.

Further, in the aforementioned method of producing a field emission type electron emitting device, a good-quality insulating layer and a good-quality silicon thin film are obtained easily as long as an SOI wafer of the type having a single-crystal silicon substrate and a single-crystal silicon thin film stuck to each other through a thermally oxidized film is used. As a result, not only the process of producing an electron emitting device can be simplified but also this type SOI wafer contributes to stabilization of quality.

Further, in the case of employing the producing method comprising the steps of: first, forming a roughly rectangular shape of an emitter in the SOI wafer; next, removing the thermally oxidized silicon film by a required thickness by means of etching to thereby form a concave portion on a side of the emitter; depositing a gate electrode material onto the whole surface; removing the electrode material deposited on portions other than the concave portion on the side of the emitter by a lift-off method and by means of etching, and finally, processing the roughly rectangular shape of the emitter electrode into a desired shape; it is possible to obtain a field emission type electron emitting device good in reproducibility and stable in quality.

Further, by carrying out the anisotropic wet etching method with use of a potassium hydroxide solution, a wedge-like or comb-like emitter having a sharp edge constituted by at least two (111) faces can be formed because the (111) faces are densest and stable.

Figure 7:
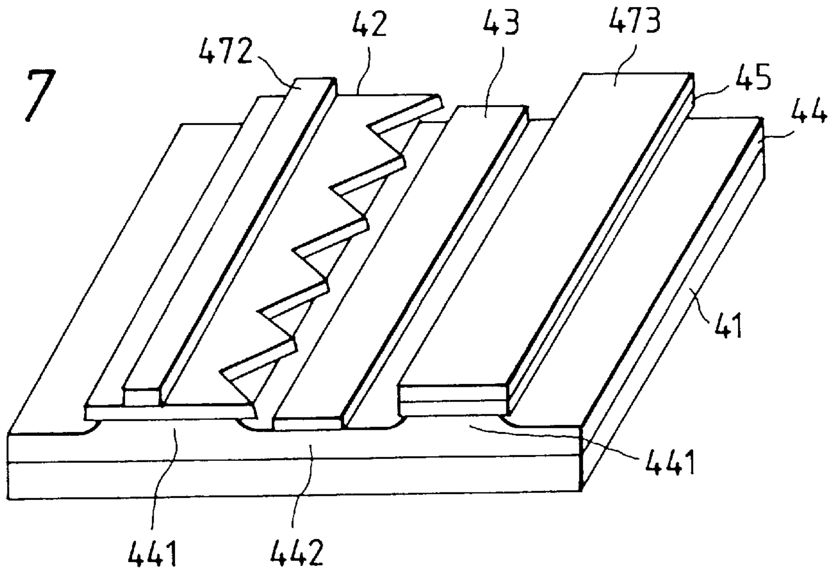
FIG. 7 is a partly perspective view of an electron emitting device according to a second embodiment of the present invention.

FIG. 7 shows the configuration of a second embodiment of the present invention and a method of producing the same. On a silicon oxide layer 44 on a silicon substrate 41, there are provided steps with respect to which a wedge type emitter 42 and an anode electrode 45 each made of a single-crystal silicon thin film are disposed on insulating layer convex portions 441, respectively, and a gate electrode 43 made of a refractory metal is disposed on an insulating layer concave portion 442 between the emitter 42 and the anode electrode 45. Further, an emitter pad 472 made of an Mo film and an anode pad 473 are provided on the emitter 42 and the anode electrode 45, respectively. These pads are effective for reduction of wiring resistance, protection of the emitter 42 and the anode electrode 45, and so on.

Figure 8:
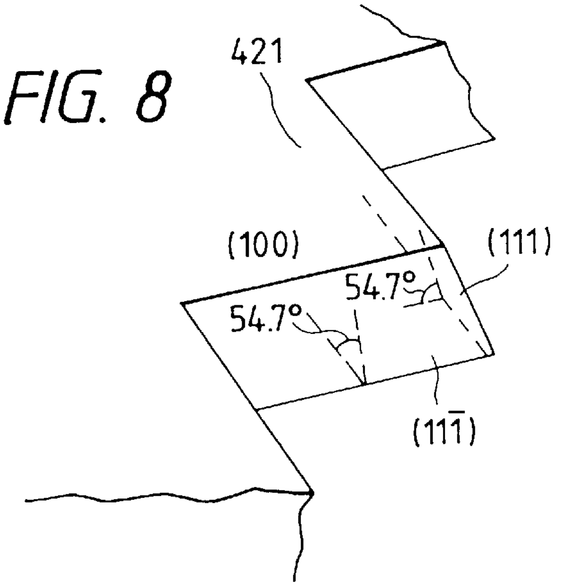
FIGS. 8 is an enlarged view of a pointed end of the emitter of the electron emitting device shown in FIG. 7.

FIG. 8 is an enlarged view of a pointed end portion 421 of the emitter 42. Assuming now that the crystal orientation of the single-crystal silicon thin film 421 constituting the emitter 42 is, for example, defined so that the main surface is a (100) face and the direction of the wedge is <0,1,0>, then the end face of the wedge is constituted by two (111) faces, namely, (1,1,1) face and (1,1,−1) face, by anisotropic wet etching which will be described later. As a result, there is formed a sharp edge in which the two (111) faces intersect the substrate face at angles of about 55° as shown in FIG. 8. That is, the form of the wedge-like end portion 421 of the emitter from which electrons are emitted is defined by the crystal faces, so that the end portion 421 is sharpened with very excellent reproducibility to thereby improve electron emitting characteristic. The electron emitting device of FIG. 7 can be produced by the producing method shown in FIGS. 3A to 3D and FIGS. 4A to 4D as long as the orientation of crystal is changed. Incidentally, photomasks used herein must be changed so as to be slightly different from those shown in FIGS. 5A and 5B and FIGS. 6A and 6B.

Figure 9:
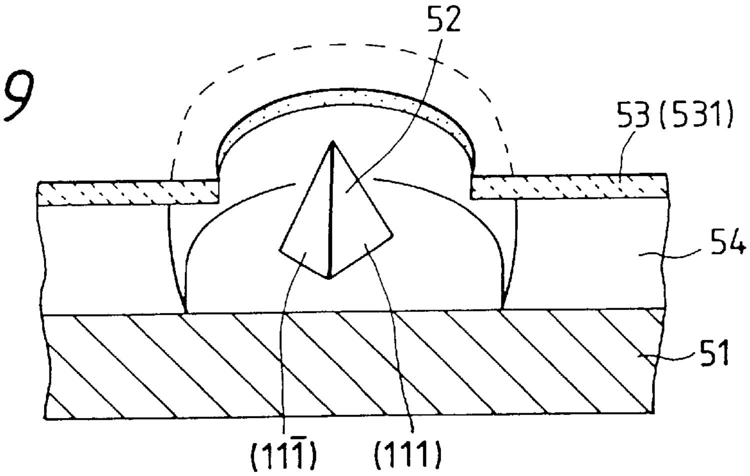
FIG. 9 is a partly perspective sectional view of an electron emitting device according to a third embodiment of the present invention.

FIG. 9 is a partly perspective sectional view of a third embodiment of the present invention. The device comprises: a gate electrode 53 formed by processing a single-crystal silicon thin film 531 of an SOI wafer composed of a silicon substrate 51 which is oriented to a (100) face, a silicon oxide layer 54 and the single-crystal silicon thin film 531 (silicon thin film thickness: 0.2 μm; silicon oxide layer thickness: 2 μm) (FIG. 10); an opening portion 58 formed by removing the silicon oxide layer 54 just under the gate electrode 53; and an emitter 52 made of a convex portion of single-crystal silicon epitaxially grown on a surface of the silicon substrate 51 and at a center of the opening portion 58. In this occasion, the single-crystal silicon convex portion of the emitter 52 is shaped like a pyramid having four (111) side faces formed by anisotropic wet etching which will be described layer. Accordingly, the angle between two opposite (111) faces becomes 70°. That is, the shape of the pointed end of the single-crystal silicon convex portion of the emitter 52 from which electrons are emitted is defined by the crystal faces, so that the pointed end is sharpened with very excellent reproducibility to thereby improve electron emitting characteristic.

Also in this configuration, when the gate electrode 53 is formed of a silicon thin film formed on the silicon oxide layer 54, a thin film of further higher purity than the conventionally used metal film such as a W film, an Mo film, or the like, is obtained. In the case where a particularly fine structure is to be produced, non-uniformity caused by impurities is avoided so that the resulting structure is excellent in the shape reproducibility after processing.

Particularly, when the gate electrode 53 is constituted by a single-crystal silicon thin film formed on the silicon oxide layer 54, non-uniformity caused by the crystal grain boundary as described preliminarily is avoided so that the resulting structure becomes more excellent in the shape reproducibility after processing. The top end can be pointed because of a single crystal in comparison with the case of a metal emitter.

Further, when the insulating layer is constituted by a silicon oxide layer obtained by thermal oxidation of the single-crystal silicon substrate, not only the insulating layer matches the silicon thin film well as described preliminarily but also the insulating layer can be formed easily.

Further, when the emitter 52 is constituted by single-crystal silicon epitaxially grown on the single-crystal silicon substrate 51, non-uniformity caused by the crystal grain boundary is avoided so that the resulting structure becomes more excellent in the shape reproducibility after processing.

Figure 10A:
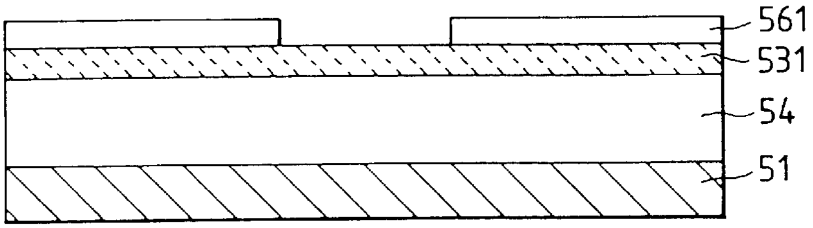
FIGS. 10A to 10D are partly sectional views successively showing steps of producing the electron emitting device shown in FIG. 9.
Figure 10B:
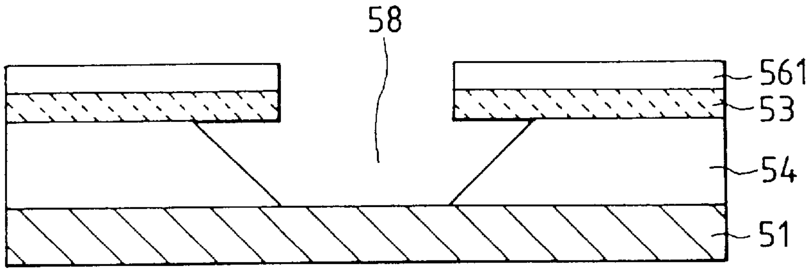
Figure 10C:
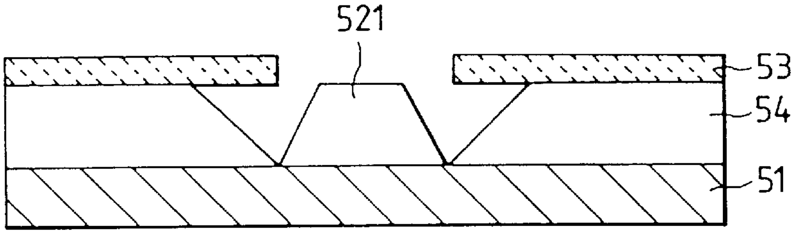
Figure 10D:
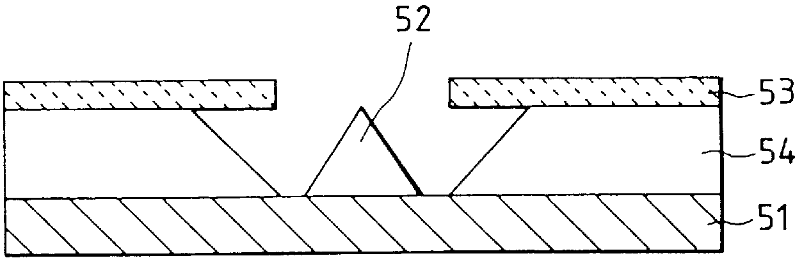

FIGS. 10A to 10D are sectional views showing a method of producing the device according to the third embodiment of the present invention shown in FIG. 9. First, a photoresist is applied onto a silicon thin film 531 of an SOI wafer composed of a silicon substrate 51, a silicon oxide layer 54 and a single-crystal silicon thin film 531 each oriented to a (100) face (silicon thin film thickness: 0.2 μm; silicon oxide layer thickness: 2 μm) to thereby form a first pattern 561 by using a mask not shown. Then, an opening portion is formed in the single-crystal silicon thin film 531 by a dry etching method to thereby form a gate electrode 53 (FIG. 10A). Then, the silicon oxide layer 54 is removed by etching with a buffer hydrofluoric acid through the opening portion of the gate electrode 53 to expose the surface of the single-crystal silicon substrate 51 to thereby form an opening portion 58 (FIG. 10B). Then, amorphous silicon 521 is deposited onto the exposed portion of the single-crystal silicon substrate 51 by a sputtering method, a vacuum vapor deposition method, or the like. Then, the amorphous silicon deposited on the resist pattern 561 is removed by a lift-off method (FIG. 10C). Then, a part of the amorphous silicon 521 in the opening portion 58 is heated or subjected to ion radiation so that the part of the amorphous silicon is recrystallized correspondingly to the orientation of the substrate. In this occasion, a pyramid shape constituted by four (111) faces is formed in the inside of the amorphous silicon 521. Finally, portions other than the monocrystallized portion of the amorphous silicon are removed by anisotropic wet etching with a potassium hydroxide, or the like, to leave only the pyramid to thereby form an emitter 52 (FIG. 10D).

In the aforementioned producing method, a good-quality uniform insulating layer and a good-quality uniform silicon thin film are obtained easily so as to contribute stabilization of quality as long as there is used an SOI wafer of the type having a single-crystal silicon substrate and a single-crystal silicon thin film stuck to each other through a thermally oxidized film.

Further, because the (111) faces are densest and stable so that the (111) faces can be expressed easily by anisotropic etching, a field emission type electron emitting device good in reproducibility and stable in quality is obtained as long as the pyramid of single-crystal silicon constituted by the (111) faces is provided as the emitter as described above.

Further, amorphous silicon 52 may be deposited onto a surface of the single-crystal silicon substrate 51 in the opening portion 58 from which the silicon oxide layer 54 has been removed, so that single-crystal silicon can be epitaxially grown at a high temperature instead of the crystallization due to heating, or the like.

As described above, in a comb-like or wedge-like field emission type electron emitting device, the processing property of the shape of an emitter, the reproducibility thereof, and so on, are improved by using a silicon thin film, particularly a single-crystal silicon thin film, as the emitter or as each of the emitter and anode electrode. Further, when the orientation of crystal in the single-crystal thin film is a (100) face, an emitter having a sharp edge defined by the crystal faces can be formed so that an electron emitting device stable in electron emitting characteristic is obtained. Because a single-crystal silicon thin film of an SOI wafer is used, there arise further advantages in attainment of more sharpening of the pointed end of the emitter, accurate control of the thickness of the emitter, and so on.

Further, in a conical electron emitting device, the processing property of the shape of a gate electrode, the reproducibility thereof, and so on, are improved by using a silicon thin film, particularly a single-crystal silicon thin film, as a gate electrode. Further, when the orientation of crystal in the silicon substrate is a (100) face, an emitter having a sharp edge defined by the crystal faces can be formed so that an electron emitting device stable in electron emitting characteristic is obtained.

Further, in a method of producing an electron emitting device, not only the thin film generating steps are simplified by using an SOI wafer but also the number of metal materials necessary for the generation of the thin film can be limited to one. At the same time, etching steps can be reduced. In addition, the simplification of steps has a merit in that steps in the conventional semiconductor process can be shared. It is a matter of course that the simplification of steps is connected to reduction in cost.

What is claimed is:

1. A method of producing a field emission type electron emitting device, comprising the steps of:

forming a roughly rectangular emitter electrode from a single-crystal silicon thin film stuck onto a single-crystal silicon substrate having a thermally oxidized film on its surface;

removing said thermally oxidized silicon film by a required thickness by means of etching to thereby form a concave portion between said emitter and an anode electrode;

depositing a gate electrode material onto the whole surface; removing said electrode material deposited on portions other than the concave portion between said emitter and said anode electrode by a lift-off method and by means of etching; and processing the shape of said roughly rectangular emitter electrode into a desired shape.

2. A method of producing a field emission type electron emitting device that comprises:

an insulating layer having a convex portion;

an emitter disposed on a peak face of the convex portion of said insulating layer, wherein said emitter comprises a single-crystal silicon thin film formed on said insulating layer; and a gate electrode provided on a valley face of the convex portion of said insulating layer opposite to said emitter, said gate electrode supplied with a voltage for drawing electrons out of said emitter, wherein said method comprises the steps of:

forming a roughly rectangular emitter electrode from a single-crystal silicon thin film stuck onto a single-crystal silicon substrate having a thermally oxidized film on its surface;

removing said thermally oxidized silicon film by a required thickness by means of etching to thereby form a concave portion between said emitter and an anode electrode;

depositing a gate electrode material onto the whole surface;

removing said electrode material deposited on portions other than the concave portion between said emitter and said anode electrode by a lift-off method and by means of etching; and processing the shape of said roughly rectangular emitter electrode into a comb or wedge shape.

3. A method of producing a field emission type electron emitting device according to claim 2, wherein said single-crystal silicon thin film comprises a single-crystal silicon thin film having a (100) crystal face as a main surface.

4. A method of producing a field emission type electron emitting device according to claim 3, wherein said emitter has a pointed end portion which serves to radiate electrons and which is constituted by two or more (111) faces.

5. A method of producing a field emission type electron emitting device according to claim 4, wherein said emitter is shaped like a comb in plan so that electrons are radiated from two pointed end portions formed in the opposite ends of a comb-like edge of said emitter.

6. A method of producing a field emission type electron emitting device according to claim 5, wherein, when said single-crystal silicon thin film is processed so that the emitter is shaped like a comb or like a wedge in a top view, the pointed end portion of the emitter is processed by an anisotropic wet etching method to thereby form said comb or wedge shape from at least from at least two (111) faces.

7. A method of producing a field emission type electron emitting device comprising:

a substrate;

an insulating layer formed on said substrate and having an opening;

a pyramid-shaped emitter formed in the opening of said insulating layer;

a gate electrode disposed around a pointed end portion of said emitter, wherein said gate electrode comprises a single-crystal silicon thin film formed on said insulating layer; and said gate electrode being supplied with a voltage for drawing electrons out of said emitter, wherein said method comprises the steps of:

applying a dry etching method to the single-crystal silicon thin film stuck onto the single crystal silicon substrate having a thermally oxidized surface to thereby form an opening portion as said gate electrode;

removing said thermally oxidized silicon film by etching with a buffer hydrofluoric acid through said opening portion of said single-crystal silicon thin film to thereby expose the surface of said single-crystal silicon substrate;

depositing amorphous silicon onto the exposed portion of said single-crystal silicon substrate by a sputtering method or by a vacuum vapor deposition method;

heating the amorphous silicon or radiating ion beams onto the amorphous silicon to thereby monocrystallize a part of the amorphous silicon in accordance with the orientation of the substrate; and removing portions other than the monocrystallized portion of the amorphous silicon by an anisotropic wet etching method to form as the emitter a single-crystal silicon pointed end portion constituted by at least two (111) faces.

8. A method of producing a field emission type electron emitting device according to claim 7, wherein said insulating layer is made of silicon oxide.

9. A method of producing a field emission type electron emitting device according to claim 7, wherein said emitter is made of single-crystal silicon epitaxially grown on said single-crystal silicon substrate.

10. A method of producing a field emission type electron emitting device according to claim 7, wherein said single-crystal silicon substrate comprises a silicon single-crystal thin film having a (100) crystal face as a main surface.

11. A method of producing a field emission type electron emitting device comprising:

a substrate;

an insulating layer formed on said substrate and having an opening;

a pyramid-shaped emitter formed in the opening of said insulating layer;

a gate electrode disposed around a pointed end portion of said emitter, wherein said gate electrode comprises a single-crystal Si thin film formed on said insulating layer; and said gate electrode being supplied with a voltage for drawing electrons out of said emitter, wherein said emitter is made of a silicon single-crystal epitaxially grown on a surface of the single crystal silicon substrate which is a bottom of the opening portion formed by removing the thermally oxidized silicon film under the gate electrode.

12. A method of producing a field emission type electron emitting device according to claim 11, wherein said insulating layer is made of silicon oxide.

* * * * *